United States Patent [19]

Miyake

[11] Patent Number: 5,070,236

[45] Date of Patent: Dec. 3, 1991

[54] IMAGE SENSOR WITH LOAD CAPACITORS FORMED FROM COMMON AND INDIVIDUAL ELECTRODES

[75] Inventor: Hiroyuki Miyake, Kanagawa, Japan

[73] Assignee: Fuji Xerox Co., Ltd., Tokyo, Japan

[21] Appl. No.: 578,889

[22] Filed: Sep. 7, 1990

[30] Foreign Application Priority Data

Oct. 4, 1989 [JP] Japan .................................. 1-257947

[51] Int. Cl.$^5$ .............................................. H01J 40/14
[52] U.S. Cl. ............................ 250/208.1; 358/213.18
[58] Field of Search .......................... 250/208.1, 208.2; 358/213.18, 213.15, 213.16; 357/30 H, 30 D

[56] References Cited

U.S. PATENT DOCUMENTS

| 4,646,155 | 2/1987 | Miyazawa et al. | 358/213.18 |
| 4,703,169 | 10/1987 | Arita | 250/208.1 |
| 4,977,304 | 12/1990 | Ino et al. | 250/208.1 |
| 4,992,653 | 2/1991 | Kawahara et al. | 250/208.1 |

FOREIGN PATENT DOCUMENTS 62-9358 1/1988 Japan .
63-67772 3/1988 Japan .

Primary Examiner—David C. Nelms
Assistant Examiner—Que T. Le
Attorney, Agent, or Firm—Finnegan, Henderson, Farabow, Garrett and Dunner

[57] ABSTRACT

An image sensor comprises a light-receiving element array, switching elements for transferring electric charges from the light-receiving element array, multilayer interconnection, load capacitors for storing the transferred electric charges, which includes one electrode which is an individual electrode and the other electrode which is a common electrode, the electrodes interposing an insulating layer therebetween, a drive IC for sequentially applying the electric charges, and common signal lines guiding the electric charges form capacitors to the drive IC. The image sensor is characterized in that, the individual electrode of the load capacitor constitutes an upper electrode, the common electrode of the load capacitor constitutes a lower electrode; and the insulating layer is formed of a high dielectric constant material. Therefore, the lower common electrode can be formed free from irregularities and the respective upper individual electrodes are also formed consistently. Further, the load capacitors can be formed small in size with a large capacitance.

3 Claims, 4 Drawing Sheets

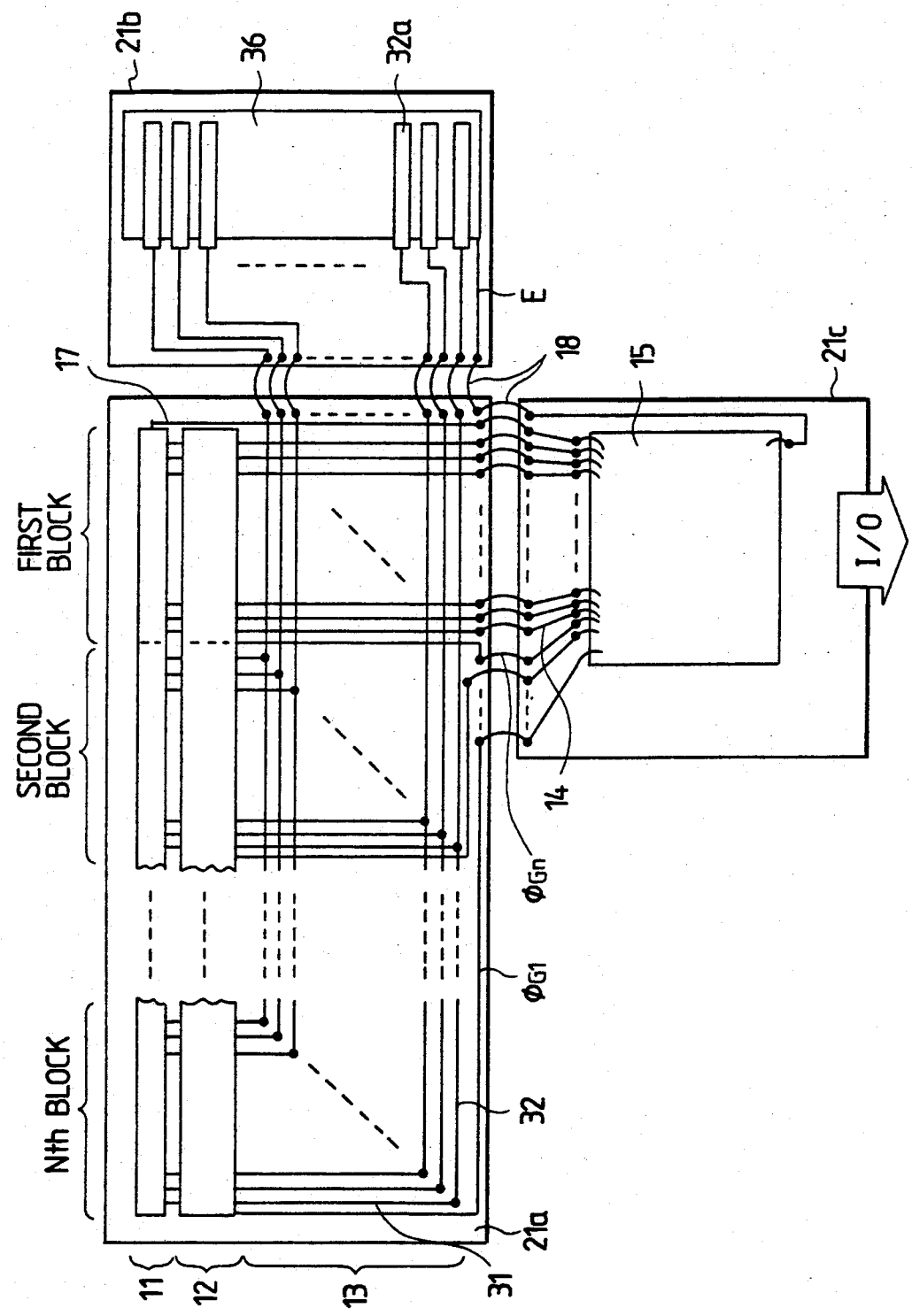

IMAGE SENSOR WITH LOAD CAPACITORS FORMED FROM COMMON AND INDIVIDUAL ELECTRODES

BACKGROUND OF THE INVENTION

This invention relates to image sensors for use in such devices as facsimile machines and scanners, and more particularly to image sensors that are small in size and capable of producing accurately read signals.

Among conventional image sensors, particularly, those of contact type, there is a TFT-driven image sensor, which projects image data of an original or the like on a one-to-one basis and converts it into an electric signal. In this case, the projected image is divided into a number of picture elements (light-receiving elements) and the electric charges generated at the respective light-receiving elements are temporarily stored in load capacitors by a block consisting of a predetermined number of light-receiving elements using thin film transistor switching elements (TFT) and read as electric signals sequentially and chronologically at speeds of from several hundreds of KHz to several MHz. In the TFT-driven image sensor, the operation of the TFTs allows only a single drive IC to read the image data, thus contributing to reducing the number of drive ICs.

The TFT-driven image sensor, whose equivalent circuit diagram is shown, e.g., in FIG. 6, comprises a line-like light-receiving element array 11 whose length is substantially the same as the width of an original, an electric charge transfer unit 12 consisting of a plurality of thin film transistors $T_{N,n}$ whose number corresponds to that of light-receiving elements 11' on a one-to-one basis, and multilayer interconnection 13.

The light-receiving element array 11 is divided into a plurality (N) of blocks, each block consisting of a plurality (n) of light-receiving elements 11'. The plurality (n) of light-receiving elements 11' can be expressed equivalently as a photodiode $PD_{N,n}$. Each light-receiving element 11' is connected to the drain electrode of each thin film transistor $T_{N,n}$. The source electrode of each thin film transistor $T_{N,n}$ is connected to each common signal line 14 (n lines) and each load capacitor $C_n$ every light-receiving element block through the matrix-like connected multilayer interconnection 13. The gate electrode of each thin film transistor $T_{N,n}$ is connected to a gate pulse generating circuit (not shown) so that the thin film transistor can be energized every block. The photoelectric charges generated at each light-receiving element 11' are stored by the parasitic capacitor of each light receiving element and by the overlap capacitor between the drain and gate of the thin film transistor for a predetermined time period, and then are sequentially transferred to and stored by the load capacitor $C_n$ every block using the thin film transistor $T_{N,n}$ as a transfer switch. That is, when a gate pulse $\phi G1$ from the gate pulse generating circuit (not shown) is applied to turn on thin film transistors $T_{1,l}$ to $T_{1,n}$ of a first block, electric charges generated and stored by the respective light-receiving elements 11' of the first block are transferred to and stored by the respective load capacitors $C_l$ to $C_n$. The potentials of the respective common signal lines 14 are changed by the amount of electric charges stored by the load capacitors, and these changed voltage values are used to sequentially turn on analog switches $SW_l$ to $SW_n$ within the drive IC 15 thereby to draw out them to an output line 16 chronologically. By turning on thin film transistors $T_{2,l}$ to $T_{2,n}$, through $T_{N,l}$ to $T_{N,n}$ of the second to Nth blocks by gate pulses $\phi G2$ to $\phi Gn$, the electric charges stored by the light-receiving elements are transferred every block and sequentially read. This sequential operation allows image signals to be obtained every line of the original in a main scanning direction, and the image signals covering the entire original can be obtained by repeating this operation, while feeding the original by an original feeding means (not shown) such as a roller (See: Japanese. Patent Unexamined Publication No. 9358/1988).

Further, as shown in FIGS. 6 and 7, the conventional load capacitors $C_n$ comprise an individual lower electrode portions 41 made of such a material as chromium (Cr) on a substrate below the multilayer interconnection 13 on the extension of the lines drawn from the source electrodes of the thin film transistors $T_{1,l}$ to $T_{1,n}$ in unitization with these lines; an insulating layer 42 arranged above these lower electrode portions 41 and made of such a material as polyimide, $SiN_x$, and $SiO_2$, which insulating layer being used as the insulating layer interposed between the upper and lower lines of the multilayer interconnection 13; and a belt-like common electrode portion deposited on the insulating layer 42 and made of such a material as aluminum (Al) thereby to form an upper electrode 43 portion which is, e.g., grounded to maintain a predetermined potential.

However, the image sensor thus constructed requires each load capacitor $C_n$ whose capacitance is so many as several hundreds of pF that in the case where such a general insulating material as polyimide is used as a dielectric of the load capacitor $C_n$, the area of the load capacitor must be large, thereby presenting the problem of having to increase the size of the image sensor.

Further, in such an image sensor as described above, the load capacitor $C_n$ is so constructed that the lower electrode 41 is used as the individual electrode and connected to the thin film transistor $T_{N,n}$ via the matrix-like multilayer interconnection 13 and the upper electrode 43 is connected to the earth as the belt-like common electrode. In order to increase particularly the capacitance of the load capacitor, the film thickness of the upper and lower electrodes must be decreased. However, as shown in FIG. 7, with the load capacitor constructed as described above, the irregularities formed by the lower electrodes 41 cause the surface of the upper common electrode 43 to be likewise irregular and thus make it difficult to flatten the surface. As a result, not only each interface of the irregularities becomes subject to shorts or breakage but also the non-flat surface of the upper common electrode 43 makes the designed allowable capacitance no longer valid, thus presenting the problem that reading accuracy is not satisfactory.

SUMMARY OF THE INVENTION

The present invention has been made in view of the above problems and has as an object the provision of an image sensor which is made smaller in size and capable of accurately reading the amount of electric charges.

In order to overcome the above problems of the conventional art, the present invention provides an image sensor comprising: a light-receiving element array having a plurality of light-receiving elements; switching elements for transferring electric charges generated at the light-receiving elements every block consisting of a predetermined number of light-receiving elements; multilayer interconnection for transferring the electric charges; load capacitors, connected to the multilayer interconnection and arranged by a number corresponding to the predetermined number of light-receiving elements within the block, for storing the transferred electric charges; a drive IC for sequentially applying the electric charges stored by the load capacitors as voltage values; and common signal lines guiding the electric charges from the load capacitors to the drive IC, each of the load capacitors comprising one electrode which is an individual electrode and the other electrode which is a common electrode, the electrodes interpose an insulating layer therebetween.

Such an image sensor is characterized in that: the individual electrode of the load capacitor constitutes an upper electrode; the common electrode of the load capacitor constitutes a lower electrode; and the insulating layer is formed of a high dielectric constant material.

According to the present invention, each load capacitor for transferring and storing electric charges generated at each light-receiving element every block by the operation of the TFT switching elements is so constructed that its individual electrode to be connected to the matrix-like multilayer interconnection is used as the upper electrode; its common electrode to be connected to the earth, as the lower electrode; and its insulating layer interposed between these upper and lower electrodes is formed of a high dielectric constant material. Therefore, the lower belt-like common electrode can be formed free from irregularities and the respective upper individual electrodes are also formed consistently, thereby causing no shorts or breakage in the electrodes of each load capacitor or errors in its allowable capacitance. Further, the arrangement of an insulating layer dedicated to the load capacitors, which is made of a special material having a high dielectric constant, instead of diverting the insulating layer of the multilayer interconnection to that of the load capacitors, allows a small-sized capacitor having a large capacitance to be formed.

BRIEF DESCRIPTION OF THE DRAWINGS

FIG. 5 is a plan view illustrating the appearance of an image sensor which is another embodiment of the present invention;

DETAILED DESCRIPTION OF THE PREFERRED EMBODIMENTS

An embodiment of the present invention will be described with reference to the drawings.

Figure 6:
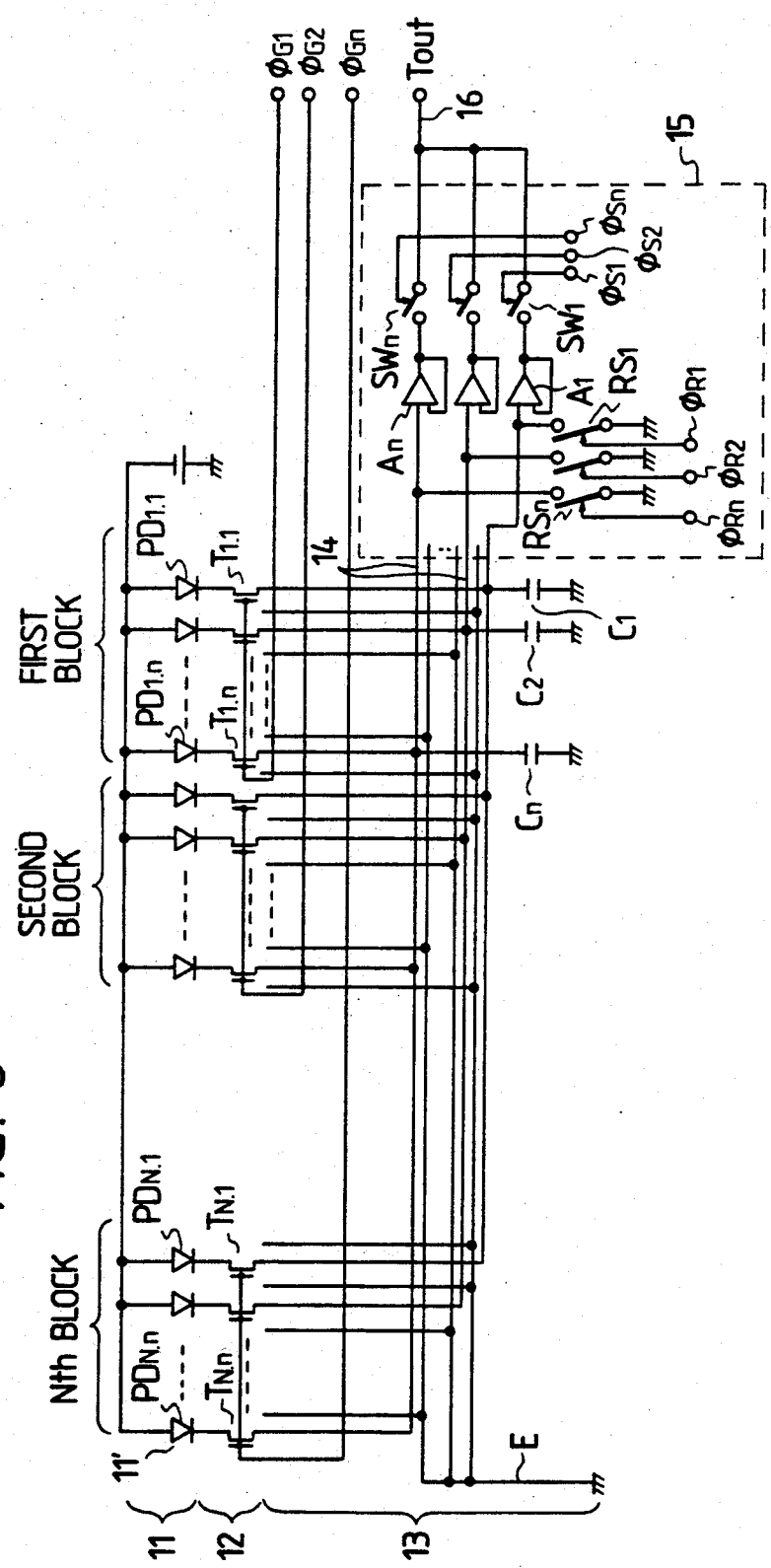
FIG. 6 is an equivalent circuit diagram of a TFT driven image sensor.

An equivalent circuit of the image sensor which is the embodiment of the present invention is the same as FIG. 6, and any portion having the similar construction is described with the same reference numeral.

The image sensor comprises: a plurality of blocks, each block being formed of a plurality (n) of sandwich-type light-receiving elements (photodiode PD) $11'$ juxtaposed on a substrate made of an insulating material such as glass; a light-receiving element array 11 ($PD_{l,l}$ to $PD_{N,n}$) consisting of a plurality (N) of blocks; an electric charge transfer unit 12 consisting of thin film transistors $T_{l,l}$ to $T_{N,n}$, each of which is connected to each light-receiving element $11'$; matrix-like multilayer interconnection 13 including an earth line E; a plurality (n) of common signal lines 14 corresponding to the light-receiving elements within each block extending from the electric charge transfer unit 12 through the multilayer interconnection 13; analog switches $SW_l$ to $SW_n$ within a drive IC 15 to which the common signal lines 14 are connected; and load capacitors $C_l$ to $C_n$ arranged along the common signal lines 14. The earth line E is disposed to prevent crosstalk between lines. A bias line 17 serves to supply bias power to the respective light-receiving elements $11'$.

Figure 3:
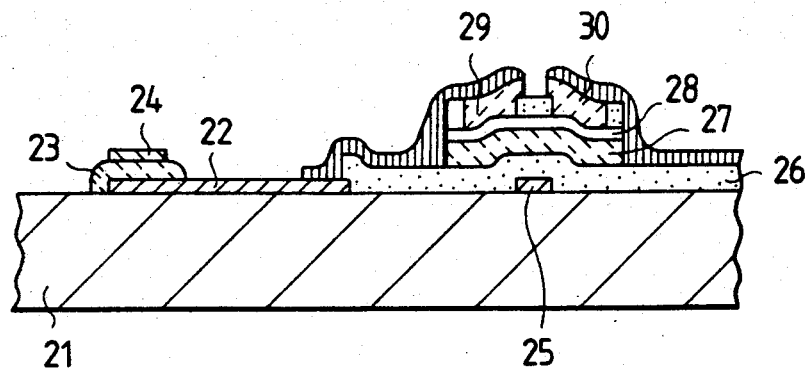
FIG. 3 is a sectional view illustrating the light-receiving element and electric charge transfer portion of the image sensor which is the embodiment of the present invention.

As shown by the illustrative sectional view in FIG. 3, each light-receiving element $11'$ comprises: a metal electrode 22 made of a metal such as chromium (Cr) which is a lower individual electrode; a photoconductive layer 23 made of hydrogenated amorphous silicon (a-Si:H); and an upper transparent electrode 24 made of indium-tin oxide (ITO) sequentially deposited on the substrate 21 that is made of a material such as glass in the form of a sandwich. In this case, each lower metal electrode 22 is formed by being dispersively divided in a main scanning direction; the photoconductive layer 23 is arranged so as to be belt-like on the metal electrode 22; and the upper transparent electrode 24 is formed so as to serve as a belt-like common electrode. In such a construction, a portion in which the photoconductive electrode 23 is interposed between the metal electrode 22 and the transparent electrode 24 constitutes the light-receiving element $11'$, and a block consisting of a plurality of such light-receiving elements forms the light-receiving element array 11. Also, from one end of the metal electrode 22 which is formed by being divided dispersively is a line drawn to be connected to the drain electrode of each thin film transistor $T_{N,n}$ of the electric transfer unit 12. In the light-receiving element $11'$, CdSe (cadmium selenide) or the like may replace the hydrogenated amorphous silicon to form the photoconductive layer.

Further, each thin film transistor $T_{N,n}$ constituting the electric charge transfer unit 12 is an inversely staggered type transistor having a chromium layer as a gate electrode 25, a silicon nitride film as a gate insulating film 26, a hydrogenated amorphous silicon (a-Si:H) layer as a semiconductive activation layer 27, an n+ hydrogenated amorphous silicon (n+ a-Si:H) layer as an ohmic contact layer 28, an aluminum layer as a drain electrode 29, and an aluminum layer as a source electrode 30 sequentially deposited on the substrate 21. To the drain electrode 29 a line from the metal electrode 22 of the light-receiving element is connected.

The construction of the multilayer interconnection 13 and each load capacitor $C_n$ will now be described with reference to FIG. 4.

The multilayer interconnection 13 comprises a chromium layer serving as a lower longitudinal line 31 and an aluminum layer serving as an upper transverse line 32. A first insulating layer 33 made of silicon nitride and a second insulating layer 34 made of polyimide is formed between the longitudinal line 31 and the transverse line 32. Thus the interconnection is formed in the form of a matrix. The construction of the insulating layer in double layer form is to prevent crosstalk at intersecting line points. Connections of both upper and lower lines are made by contact holes 35.

Figure 1:
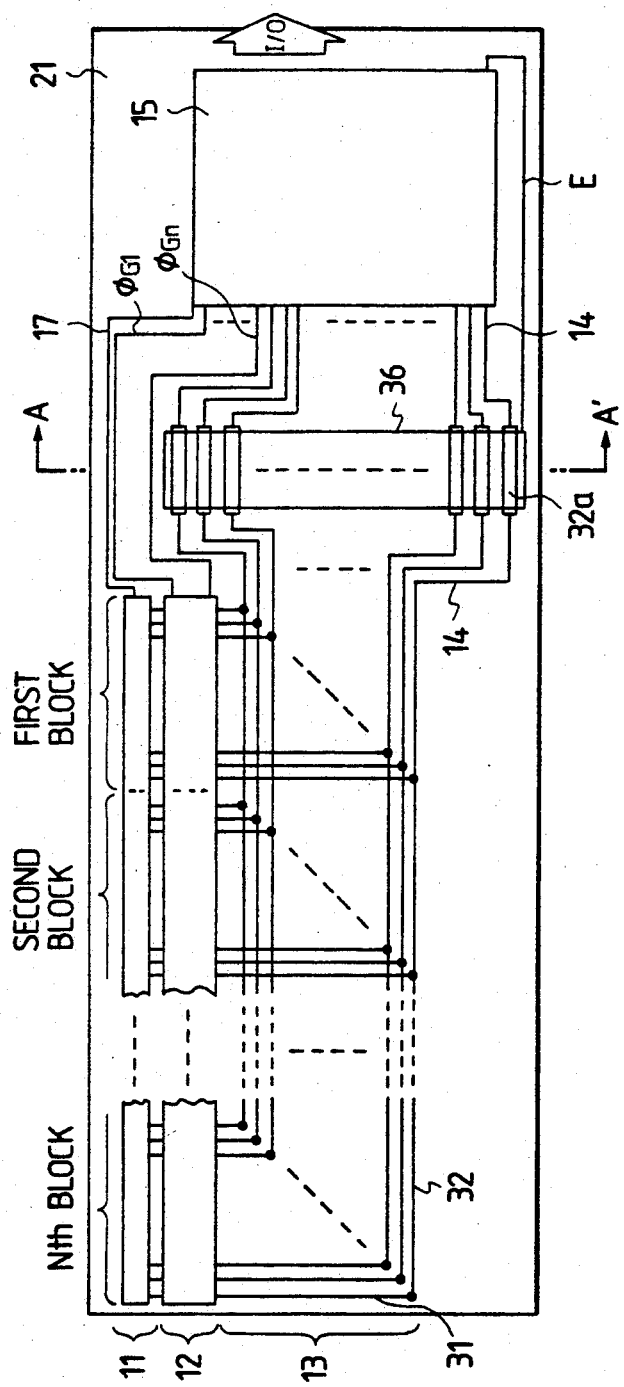
FIG. 1 is a plan view illustrating the appearance of an image sensor which is an embodiment of the present invention.
Figure 2:
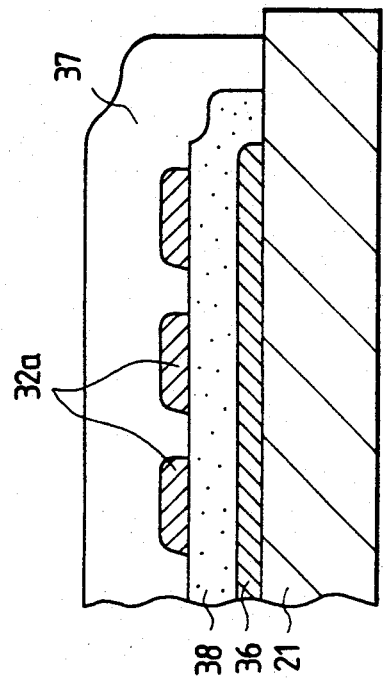
FIG. 2 is a partially sectional view illustrating the portion taken along the line A—A' of FIG. 1.
Figure 4:
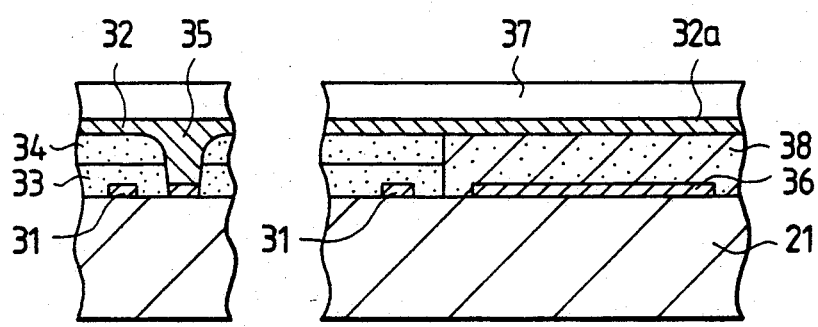
FIG. 4 is a sectional view illustrating multilayer interconnection and a load capacitor of the image sensor which is the embodiment of the present invention.
Figure 7:
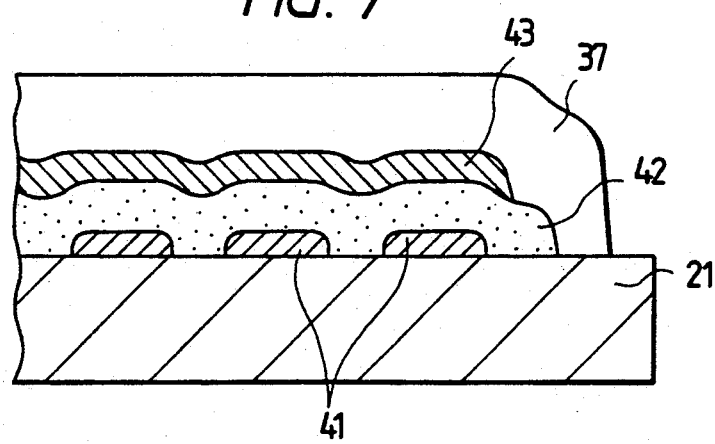
FIG. 7 is a sectional view illustrating a load capacitor of the conventional image sensor.

Each load capacitor $C_n$ comprises, as shown in FIGS. 2 and 4, a belt-like common electrode made of chromium which will serve as a lower electrode 36, on which an insulating layer 38 specially formed of a material having a high dielectric constant is deposited. Such high dielectric constant material must have a high relative dielectric constant and a high dielectric strength voltage and includes, e.g., $BaTiO_3$, $Y_2O_3$, $Sm_2O_3$, and $Ta_2O_3$. The specific inductivity and withholding voltage of these and other such materials are listed in Table 1.

TABLE 1

| High dielectric constant material | Relative dielectric constant | Dielectric strength [MV/cm] |
| --- | --- | --- |
| $Y_2O_3$ | 11–12 | 3–5 |
| $Sm_2O_3$ | 15–16 | 2–5 |
| $Al_2O_3$ | 8–10 | 5 |
| $Ta_2O_3$ | 22–25 | 2–5 |
| $BaTiO_3$ | 14–55 | 2–3 |
| $BaTa_2O_6$ | 22 | 3.5 |
| $PbNb_2O_6$ | 41 | 1.5 |
| $SrTiO_3$ | 140 | 1.5–2 |

An individual upper electrode 32a portion of each of the load capacitors $C_n$ to $C_n$ is formed of aluminum, unitized with the transverse line 32, along the extended portion of the transverse line 32 which is located on the insulating layer 28 and toward the upper portion of the multilayer interconnection 13.

The lower line 31 and the common electrode 36 arranged on the lower portion of each of the load capacitors $C_l$ to $C_n$ are prepared by the same photolithographic process and the upper line 32 and the individual electrode 32a arranged on the upper portion of the load capacitors are also formed by the same photolithographic process. A protection film 37 is arranged on the multilayer interconnection 13 and load capacitors $C_n$ thus formed.

A plurality (n) of common signal lines 14 are formed of a part of the transverse lines 32 and are connected to the analog switches $SW_l$ to $SW_n$ within the drive IC 15 via the load capacitors $C_l$ to $C_n$. The potential of the common signal lines 14 varies depending on the electric charges stored by the load capacitors $C_l$ to $C_n$, and such potential value is to be drawn out to the output line 16 (FIG. 6) by the operation of the analog switches $SW_l$ to $SW_n$.

A method of driving the image sensor which is the embodiment of the present invention will next be described.

Upon irradiation of light onto an original (not shown) placed on the light-receiving element array 11 from a light source (not shown), the reflected light is irradiated into each light-receiving element (photodiode PD) to cause electric charges to be generated corresponding to the level of darkness of the original. These generated electric charges are stored by a parasitic capacitor or the like of the light-receiving element 11'. When the thin film transistor T is turned on upon application of a gate pulse $\phi G$ from a gate pulse generating circuit (not shown), the electric charges stored by the parasitic capacitor or the like are transferred to and stored by the load capacitor $C_n$ by connecting the photodiode PD to the common signal line 14. More specifically, this operation will be described in the case where electric charges are generated at the photodiodes $PD_{1,l}$ to $PD_{1,n}$ of a first block. Upon application of a gate pulse $\phi G1$ from the gate pulse generating circuit, the thin film transistors $T_{1,l}$ to $T_{1,n}$ are turned on and the electric charges generated at the photodiodes $PD_{1,l}$ to $PD_{1,n}$ are transferred to and stored by the load capacitors $C_l$ to $C_n$ via the matrix-like multilayer interconnection 13. Thereafter, the thin film transistors $T_{1,l}$ to $T_{1,n}$ are turned off.

Then, a timing generating circuit (not shown) applies read switching signals $\phi S1$ to $\phi Sn$ sequentially to the read switches $SW_l$ to $SW_n$ of the drive IC 15 and reset switching signals $\phi R_l$ to $\phi R_n$ sequentially to reset switching elements $RS_l$ to $RS_n$ of the drive IC 15 with a delay of every one timing with respect to each read switching signal. Accordingly, the electric charges stored by the load capacitors $C_l$ to $C_n$ are delivered (T out) as image signals. The electric charges generated at each light-receiving element (photodiode PD) of the next block are then transferred.

According to the image sensor of this embodiment, in the construction of the load capacitors $C_l$ to $C_n$, to which the electric charges generated at each light-receiving element 11' of the image sensor are transferred and stored every block by the operation of the thin film transistors $T_{1,l}$ to $T_{1,n}$, the individual electrodes to be connected to the matrix-like multilayer interconnection 13 serve as the upper electrodes 32a; the common electrode to be connected to the earth serves as the lower electrode 36; and the insulating layer 38 interposed between the upper and lower electrodes is made of a high dielectric constant material such as $BaTiO_3$, $Y_2O_3$, $Sm_2O_3$, or $Ta_2O_3$. Therefore, it is possible to have the surface of the lower belt-like common electrode formed free from irregularities and the upper individual electrodes, consistent and undeformed. As a result, the electrodes of each load capacitor $C_n$ is not subject to any shorts (breakage) nor is there any error in the designed allowable capacitance, thereby contributing to improving the output accuracy of the image sensor. Further, the insulating layer 38 of the load capacitor $C_n$ is not the same insulating layer 33 used in the multilayer interconnection 13 but is a separate layer specially made of a high dielectric constant, so that it is possible to form each load capacitor $C_n$ with a large capacitance in small size, thereby contributing to generally reducing the size of the image sensor.

Although the light-receiving element array 11, the electric charge transfer unit 12 having each thin film transistor $T_n$, the multilayer interconnection 13, each load capacitor $C_n$, and the drive IC 15 are formed on the same substrate in this embodiment, it may also be possible to form the light-receiving element array 11, the electric charge transfer unit 12 having each thin film transistor $T_n$, and the multilayer interconnection 13 on a substrate 21a, each load capacitor $C_n$ on another substrate 21b, and the drive IC 15 on still another substrate 21c, as shown by another embodiment whose appearance is illustratively shown in FIG. 5, in different processes and connect them by wire bonding 18 or the like. This allows a combination of parts and thus removal of defective parts, which then contributes to improving yield in the production of image sensors. Further, if the length of the image sensor is to be shortened in the main scanning direction, it may be possible to arrange the drive IC 15 below the multilayer interconnection 13 as shown in FIG. 5.

According to the present invention, each load capacitor of the image sensor is so constructed that the individual electrodes to be connected to the matrix-like multilayer interconnection are used as the upper electrodes, the belt-like common electrode to be connected to the earth are used as the lower electrode, and the insulating layer interposed between these upper and lower electrodes is made of a high dielectric constant material. Therefore, the lower common electrode is free from irregularities and the upper individual electrodes are also consistent and undeformed. This ensures that the electrodes of each load capacitor are subject to no shorts (breakage) or that the designed allowable capacitance of the load capacitors are subject to no errors, thereby contributing to improving the output accuracy of the image sensor. Further, the insulating layer of each load capacitor is not diverted from the insulating layer of the multilayer interconnection but is separately arranged using a high dielectric constant material, thus allowing each capacitor to be formed with a large capacitance in small size. This contributes to the miniaturization of the image sensor.

What is claimed is:

1. An image sensor comprising:
   a light-receiving element array having a plurality of light-receiving elements;
   switching elements for transferring electric charges generated at said light-receiving elements every block consisting of a predetermined number of light-receiving elements;
   multilayer interconnection for transferring said electric charges;
   load capacitors, connected to said multilayer interconnection and arranged by a number corresponding to said predetermined number of light-receiving elements within said block, for storing said transferred electric charges, said load capacitors comprising one electrode which is an individual electrode and the other electrode which is a common electrode, said electrodes interpose an insulating layer therebetween;
   a drive IC for sequentially applying said electric charges stored by said load capacitors as voltage values; and
   common signal lines guiding said electric charges from said load capacitors to said drive IC;
   wherein said individual electrode of said load capacitor constitutes an upper electrode; said common electrode of said load capacitor constitutes a lower electrode; and said insulating layer is formed of a high dielectric constant material.

2. An image sensor as claimed in claim 1 wherein said high dielectric constant material is selected from the group consisting of $BaTiO_3$, $Y_2O_3$, $Sm_2O_3$, $Ta_2O_5$, $Al_2O_3$, $BaTa_2O_6$, $PbNb_2O_6$, and $SrTiO_3$.

3. An image sensor as claimed in claim 1, wherein said light-receiving element array, said switching elements, said multilayer interconnection are formed on a first substrate, said load capacitors are formed on a second substrate, and said drive IC is formed on a third substrate.

* * * * *